(12) United States Patent
Burr et al.

(10) Patent No.: US 7,683,442 B1
(45) Date of Patent: Mar. 23, 2010

(54) RAISED SOURCE/DRAIN WITH SUPER STEEP RETROGRADE CHANNEL

(76) Inventors: James B. Burr, 511 Broughton La., Foster City, CA (US) 94404; Archisman Bagchi, 3097 Florence Park Dr., San Jose, CA (US) 95135; Jawad Nasrullah, 2586 W. Bayshore Rd. Apt. 8, Palo Alto, CA (US) 94303

( * ) Notice: Subject to any disclaimer, the term of this patent is extended or adjusted under 35 U.S.C. 154(b) by 407 days.

(21) Appl. No.: 11/529,972

(22) Filed: Sep. 29, 2006

(51) Int. Cl.
| | |
|---|---|
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. .......... 257/412; 257/297; 257/305
(58) Field of Classification Search .......... 438/300, 438/297, 305, 412
See application file for complete search history.

(56) References Cited

U.S. PATENT DOCUMENTS

| 5,553,008 | A | * | 9/1996 | Huang et al. ............ 703/14 |
| 5,719,422 | A | * | 2/1998 | Burr et al. ............ 257/336 |
| 5,837,587 | A | * | 11/1998 | Wei ............ 438/305 |
| 5,915,183 | A | * | 6/1999 | Gambino et al. ............ 438/300 |
| 6,180,468 | B1 | * | 1/2001 | Yu et al. ............ 438/297 |
| 6,201,761 | B1 | * | 3/2001 | Wollesen ............ 365/233.15 |
| 6,259,118 | B1 | * | 7/2001 | Kadosh et al. ............ 257/67 |
| 6,580,137 | B2 | * | 6/2003 | Parke ............ 257/401 |
| 2006/0102958 | A1 | * | 5/2006 | Masleid ............ 257/368 |

* cited by examiner

Primary Examiner—Phuc T Dang

(57) ABSTRACT

Systems and methods for raised source/drain with super steep retrograde channel. In accordance with a first embodiment of the present invention, in one embodiment, a semiconductor device comprises a substrate comprising a surface and a gate oxide disposed above the surface comprising a gate oxide thickness. The semiconductor device further comprises a super steep retrograde channel region formed at a depth below the surface. The depth is about ten to thirty times the gate oxide thickness. Embodiments in accordance with the present invention may provide a more desirable body biasing voltage to threshold voltage characteristic than is available under the conventional art.

19 Claims, 5 Drawing Sheets

RAISED SOURCE/DRAIN WITH SUPER STEEP RETROGRADE CHANNEL

FIELD OF INVENTION

Embodiments of the present invention relate to the field of design and construction of semiconductor devices. More specifically, embodiments of the present invention relate to systems and methods for design and construction of semiconductor devices comprising raised source/drain regions in conjunction with super steep retrograde channels.

BACKGROUND

It is sometimes desirable to adjust a threshold voltage of a semiconductor device, e.g., to increase and/or decrease such threshold voltage, in a post-manufacturing environment, in response to changing operating conditions of the semiconductor device. For example, adjustment of threshold voltage via application of a body biasing voltage may be useful to adjust for manufacturing process, voltage and/or thermal variation, as well as to adjust for changing performance requirements in a semiconductor device.

SUMMARY OF THE INVENTION

Therefore, a need exists for systems and methods for design and construction of semiconductor devices comprising raised source/drain regions in conjunction with super steep retrograde channels. A need also exists for improving a relation between a body biasing voltage and a threshold voltage for a semiconductor device that also satisfies the above need. A further need exists for systems and methods for design and construction of semiconductor devices comprising raised source/drain regions in conjunction with super steep retrograde channels that are compatible and complementary with existing semiconductor design and manufacturing techniques, as well as existing methods of post-manufacturing threshold voltage control.

Accordingly, in one embodiment, a semiconductor device comprises a substrate comprising a surface and a gate oxide disposed above the surface comprising a gate oxide thickness. The semiconductor device further comprises a super steep retrograde channel region formed at a depth below the surface. In one embodiment, the depth is about ten to thirty times the gate oxide thickness.

In accordance with another embodiment of the present invention, a semiconductor device comprises a substrate having a substrate thickness and a source structure disposed above the substrate having a source thickness. The substrate thickness is sufficient to accommodate the source thickness.

In accordance with still another embodiment of the present invention, a semiconductor device comprises a super steep retrograde channel region and a raised source structure.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the figures are not drawn to scale.

DETAILED DESCRIPTION

Reference will now be made in detail to various embodiments of the invention, raised source/drain regions in conjunction with super steep retrograde channels, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Raised Source/Drain with Super Steep Retrograde Channel

It is sometimes desirable to adjust a threshold voltage of a semiconductor device, e.g., to increase and/or decrease such threshold voltage, in a post-manufacturing environment, in response to changing operating conditions of the semiconductor device. For example, a relatively lower threshold voltage generally provides a higher maximum frequency of operation for the semiconductor device. Unfortunately, such a lower threshold voltage also generally increases static current leakage of the semiconductor device. Consequently, beneficial decreases in static current consumption may be achieved by increasing threshold voltage in situations in which a relatively lower maximum frequency of operation is acceptable. It is also appreciated that adjustment of threshold voltage via application of a body biasing voltage may be useful to adjust for manufacturing process induced, voltage induced and/or thermally induced threshold voltage variations in a semiconductor.

One method to adjust the threshold voltage of a semiconductor device is to apply a body biasing voltage to the body of the semiconductor device. Changes to such a body biasing voltage generally change the threshold voltage of the semiconductor device.

Figure 1:
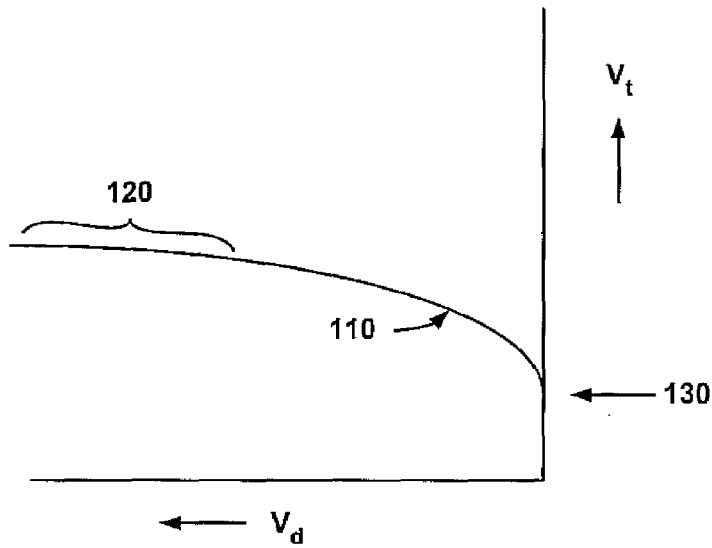
FIG. 1 illustrates an exemplary plot of threshold voltage versus body bias voltage in a typical semiconductor device, in accordance with the conventional art.

FIG. 1 illustrates an exemplary plot 100 of threshold voltage versus body bias voltage in a typical semiconductor device, in accordance with the conventional art. The vertical axis indicates threshold voltage and the horizontal axis indicates body biasing voltage. Point 130 indicates an initial threshold voltage for zero applied body bias voltage. The initial threshold voltage may be determined by many well known factors, including the channel doping.

Curve 110 generally indicates that changes to body bias voltage will produce a change to threshold voltage of the semiconductor device. However, as body bias voltage is applied, the depletion region of the channel will grow, and a charge summing effect occurs. Consequently, as the magnitude of body bias voltage increases, it becomes necessary to apply ever greater magnitudes of body bias voltage to obtain ever smaller changes in threshold voltage. This is depicted in region 120 of curve 110.

Figure 2A:
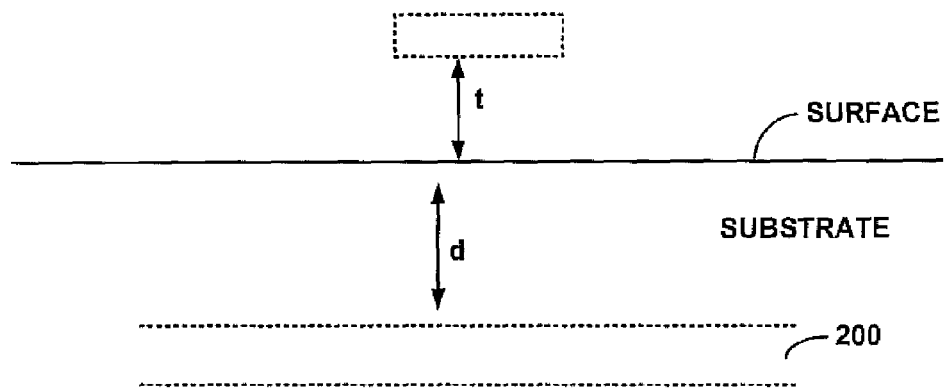
FIG. 2A illustrates a side sectional view of an exemplary super steep retrograde channel region, in accordance with embodiments of the present invention.

FIG. 2A illustrates a side sectional view of an exemplary super steep retrograde channel region 200, in accordance with embodiments of the present invention. Region 200 is formed, e.g., by implanting Indium or Boron at high energy, at a distance "d" below the substrate surface, in contrast to a more typical channel region which is formed at or near the surface of a substrate. In addition, the dopant concentration in region 200 increases with depth, in contrast to a more typical channel region in which dopant concentration decreases with depth into the substrate. This is generally known as or referred to as a "retrograde" channel doping profile. Further, region 200 is characterized as having a very, or "super" steep change in dopant concentration. The term "super steep" is a term of art, well understood by practitioners of the semiconductor arts. For example, a "super steep" change in dopant concentration attempts to approximate a step function.

Figure 2B:
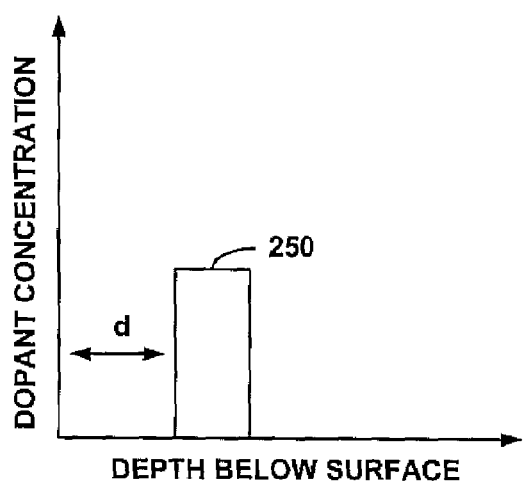
FIG. 2B illustrates a doping profile for a channel region, in accordance with embodiments of the present invention.

FIG. 2B illustrates a doping profile 250 for channel region 200, in accordance with embodiments of the present invention. The horizontal axis indicates depth below the substrate surface, while the vertical axis indicates dopant density. It is appreciated that doping profile 250 is idealized, and that such sharp changes in dopant density as illustrated are typically not achievable in real structures.

Figure 3:
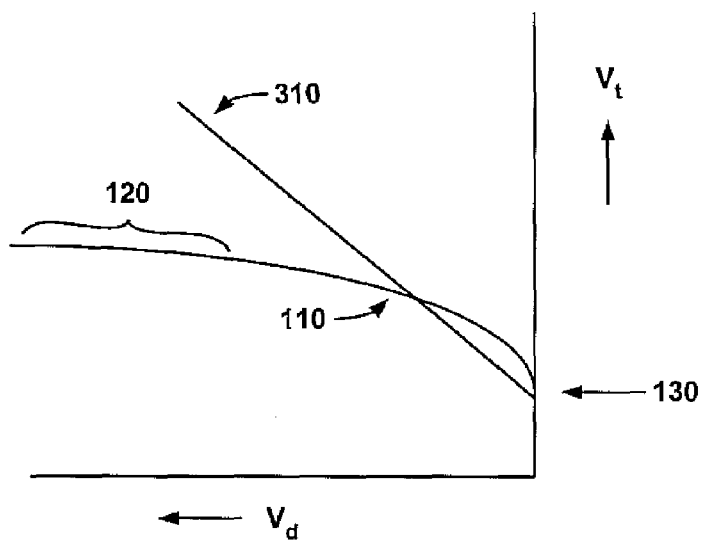
FIG. 3 illustrates an exemplary plot of threshold voltage versus body bias voltage in a semiconductor device comprising super steep retrograde channel region, in accordance with embodiments of the present invention.

FIG. 3 illustrates an exemplary plot 300 of threshold voltage versus body bias voltage in a semiconductor device comprising super steep retrograde channel region 200, in accordance with embodiments of the present invention. The vertical axis indicates threshold voltage and the horizontal axis indicates body biasing voltage.

In contrast to a conventional art semiconductor device as illustrated in FIG. 1, a depletion region due to applied body bias only grows until it impacts the upper edge of super steep retrograde channel region 200 (FIG. 2A). Consequently, threshold voltage versus body bias voltage curve 310 for a semiconductor device comprising a super steep retrograde channel, e.g., super steep retrograde channel 200, is much more linear. As a beneficial result, threshold voltage in a semiconductor device comprising a super steep retrograde channel may generally be adjusted over a wider range, and such adjustment generally results from smaller changes in body biasing voltage, in comparison to the conventional art channels.

Referring once again to FIG. 2A, a number of factors, including a desire to prevent punch-through and to optimize a body biasing voltage versus threshold voltage characteristic, e.g., curve 310 of FIG. 3, influence the depth of super steep retrograde channel 200.

In stacked gates, e.g., NAND and/or NOR gates, devices in the middle of the stack are typically neither grounded nor completely pulled up to Vdd. Consequently, such devices are intrinsically subjected to a body bias. For example, their source and/or drain terminals are at voltages other than Vdd or ground. Thus, it is generally desirable to have a low response to an extrinsically applied body biasing voltage, so as to not overly compound the intrinsic body effect.

In a contrary manner, it is desirable to have a high response to an extrinsically applied body biasing voltage to enable a wide range of threshold voltage adjustments, e.g., for performance, manufacturing process, voltage and/or thermal variation reasons.

In accordance with embodiments of the present invention, it is desirable for a one unit change in body biasing voltage to adjust threshold voltage by about $\frac{1}{10}$ to $\frac{1}{3}$ of a unit. For example, a one volt change in body bias voltage produces about a 100 to 333 millivolt change in threshold voltage. This range has proven to be a beneficial compromise between the competing influences affecting a body biasing voltage versus threshold voltage characteristic. It is to be appreciated that smaller changes in threshold voltage, e.g., a 50 mV threshold voltage change per 1 volt body bias change, are well suited to embodiments in accordance with the present invention.

For example, in accordance with embodiments of the present invention, depth "d" (FIG. 2A) is ten to 30 times a gate oxide thickness for a given semiconductor manufacturing process. Such a range of depths supports a body biasing voltage versus threshold voltage characteristic as described previously.

It is to be appreciated that a conventional source/drain region is typically implanted and heavily doped to a depth greater than ten to 30 times a gate oxide thickness. For example, most source/drain regions comprise a silicide structure, the formation of which consumes silicon in the source/drain region. Such silicide generally requires a deepening of a source/drain region. In addition, achieving a desirably low contact resistance between the silicide and diffusion generally also requires a relatively deeper source/drain region. Further, it is generally difficult to form a source/drain region of less than about 30 times a gate oxide thickness, e.g., for reasons of implant energy, thermal diffusion and/or desirably low source/drain to channel capacitance.

For example, a conventional semiconductor may comprise gate oxides that are typically about 2 nm thick. Bulk source/drain structures may typically extend to a depth of 100 nm or more. Conventional source/drain extensions may extend to a depth of 50 nm. Consequently, conventional source/drain regions typically extend to a depth of 50 or more times a gate oxide thickness.

Unfortunately, a heavily doped super steep retrograde channel, e.g., channel 200 of FIG. 2A, formed at a desirably shallow depth, tends to overlap and/or create a junction between the super steep retrograde channel and a conventional source/drain region. For example, conventional source/drain regions are typically implanted and heavily doped to a depth greater than a desirable depth of the heavily doped super steep retrograde channel. Such a junction between a super steep retrograde channel and a source/drain region may frequently be known as an "abrupt" junction.

Such a junction is generally structurally a reverse-biased junction. However, under conditions of an applied body biasing voltage, the voltage across such a junction may cause band-to-band tunneling resulting in reverse-bias junction leakage. Such biasing conditions at such junctions are generally deleterious to the function of a semiconductor device.

In accordance with embodiments of the present invention, a raised source/drain may provide the necessary thickness of material to form a satisfactory source/drain, e.g., thick enough to provide for a desirable silicide and advantageously low contact resistance, while providing clearance, e.g., not overlapping, a super steep retrograde channel placed at an advantageous depth.

At present semiconductor process geometries, e.g., for processes with a critical dimension of about 0.13 µm and less, a raised source/drain structure generally results in an undesirably high gate to source/drain capacitance. A combination of contact size requirements and other design rules generally cause the gate-side edge of a raised source/drain structure to be substantially parallel to a gate edge, resulting in a deleteriously high gate to source/drain capacitance. Consequently, most proposals for use of raised source/drain structures are found in ultra thin silicon on insulator (SOI) applications. For example, applications in which a very thin substrate, e.g., a substrate of 10-20 nm in total thickness, generally is unable to accommodate a convention source/drain implanted into the substrate. As a result, a source/drain must be formed outside of the substrate, e.g., on or in raised or elevated structures above the substrate.

In accordance with embodiments of the present invention, a raised source/drain is formed above a substrate that is otherwise thick enough to accommodate a source/drain while complying with the process design rules.

Figure 4A:
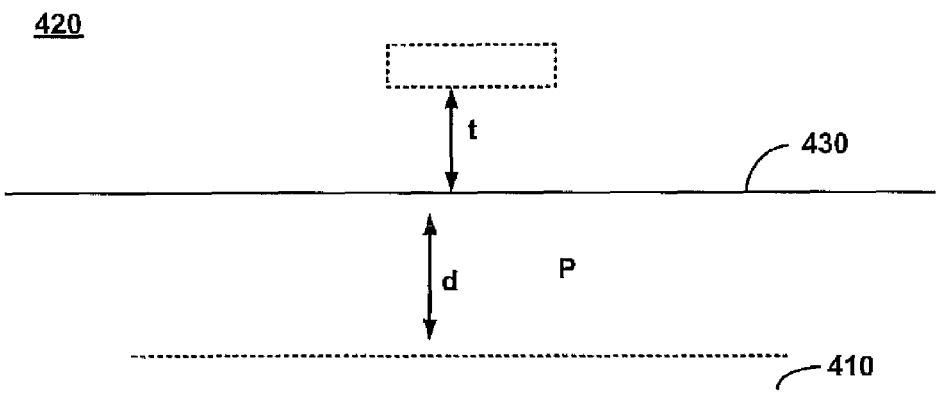
FIGS. 4A, 4B, 4C, 4D and 4E illustrate formation of a semiconductor device comprising a super steep retrograde channel with raised source/drain, in accordance with embodiments of the present invention.

FIGS. 4A-4E illustrate a formation of a semiconductor device comprising a super steep retrograde channel with raised source/drain, in accordance with embodiments of the present invention. In FIG. 4A, a super steep retrograde channel region 410 is formed in substrate 420, beginning at a depth "d" beneath surface 430 of substrate 420. In one embodiment, depth "d" may be in a range of ten to 30 times dimension "t," the eventual thickness of a gate oxide layer. It is appreciated that a gate typically has not been formed at a point in a semiconductor manufacturing process advantageous for the formation of region 410.

Channel region 410 may be formed by a variety of well-known processes, including, for example, high energy implantation of Indium. As illustrated, substrate 420 is P-type material, and super steep retrograde channel region 410 is heavily doped P-type material. Region 410 is typically not so heavily doped as to become degenerate P+ material. It is appreciated that well known symmetries between N and P type materials exit. Consequently, embodiments in accordance with the present invention are well suited to formation in N type substrates, and such embodiments are considered within the scope of the present invention.

Figure 4B:
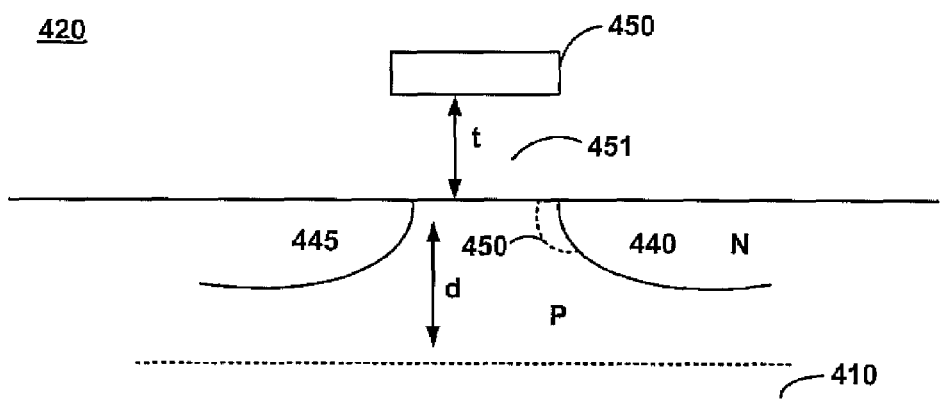

FIG. 4B illustrates the formation of shallow source extension 440 and shallow drain extension 445, in accordance with embodiments of the present invention. Gate 450 and gate oxide 451 are also illustrated. Shallow source extension 440 and shallow drain extension 445 are formed in substrate 420 to a depth such that their function is not impacted by region 410. The depth of shallow source/drain extension 440, 445, is generally less, e.g., "shallower," than the depth of conventional source/drain extensions. Optionally, an asymmetric lightly doped halo, or "punch-through stop," 450 may be formed on shallow source 440.

Figure 4C:
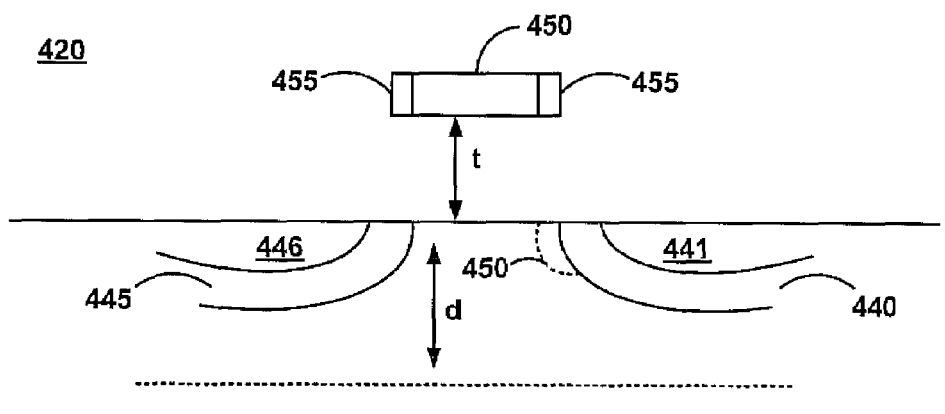

FIG. 4C illustrates formation of spacers 455 on gate 450, in accordance with embodiments of the present invention. Spacers 455 form a barrier for insulating the raised source/drain from the gate 450.

Figure 4D:
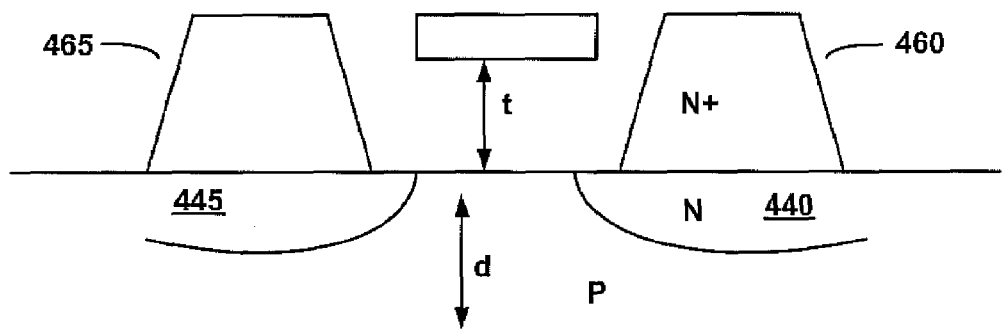

FIG. 4D illustrates formation of raised or elevated source region 460 and raised drain region 465, in accordance with embodiments of the present invention. Raised source/drain regions 460, 465 may be formed by a variety of well-known processes, including selective epitaxial growth.

In this novel manner, a semiconductor device is provided that provides a beneficial capability to adjust threshold voltage by application of a body biasing voltage. A relatively shallow super steep retrograde channel, e.g., region 410, enables a more desirable body biasing voltage to threshold voltage characteristic, while raised source/drain regions provide source/drain functionality absent detrimental impact by the shallow super steep retrograde channel.

Figure 4E:
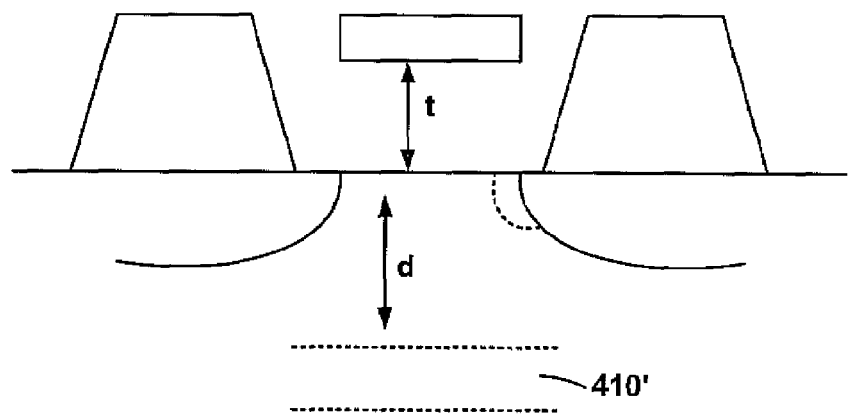

FIG. 4E illustrates an alternative embodiment of the present invention. In FIG. 4E, super steep retrograde channel 410' is formed via a masked implant such that its lateral extent is substantially limited to beneath the actual channel. For example, as shown in the view of FIG. 4E, the length of channel 410' is approximately the distance between a source and a drain. In this novel manner, junction capacitance between super steep retrograde channel 410' and a source/drain is beneficially reduced.

Embodiments in accordance with the present invention provide for systems and methods for design and construction of semiconductor devices comprising raised source/drain regions in conjunction with super steep retrograde channels. Embodiments in accordance with the present invention also provide for improving a body biasing voltage to threshold voltage relation for a semiconductor device. Further, embodiments in accordance with the present invention provide for systems and methods for design and construction of semiconductor devices comprising raised source/drain regions in conjunction with super steep retrograde channels that are compatible and complementary with existing semiconductor design and manufacturing techniques, as well as existing methods of post-manufacturing threshold voltage control.

Various embodiments of the invention, raised source/drain with super steep retrograde channel, are thus described. While the present invention has been described in particular embodiments, it should be appreciated that the invention should not be construed as limited by such embodiments, but rather construed according to the below claims.

What is claimed is:

1. A semiconductor device comprising:
   a substrate comprising a surface;
   a gate oxide disposed above said surface comprising a gate oxide thickness; and
   a super steep retrograde channel region formed at a depth below said surface, wherein said depth is about ten to thirty times said gate oxide thickness.

2. A semiconductor device of claim 1 wherein said substrate is disposed for accepting a body biasing voltage.

3. A semiconductor device of claim 1 further comprising a source structure disposed above said surface.

4. A semiconductor device of claim 3 wherein said source structure comprises epitaxially grown material.

5. A semiconductor device of claim 3 wherein said source structure comprises silicide.

6. A semiconductor device of claim 3 further comprising a source extension disposed beneath said source structure and wherein said source extension does not form a junction with said super steep retrograde channel region.

7. A semiconductor device of claim 1 wherein a horizontal extent of said super steep retrograde channel region is substantially limited to the horizontal extent of said gate oxide.

8. A semiconductor device comprising:
   a substrate having a substrate thickness;
   a source structure disposed above said substrate having a source thickness; and
   wherein said substrate thickness is sufficient to accommodate said source thickness.

9. A semiconductor device of claim 8 wherein said substrate is disposed for applying a body biasing voltage.

10. A semiconductor device of claim 8 wherein said source structure comprises epitaxially grown material.

11. A semiconductor device of claim 8 wherein said source structure comprises silicide.

12. A semiconductor device of claim 8 further comprising a super steep retrograde channel region.

13. A semiconductor device of claim 12—further comprising a source extension disposed in said substrate beneath said source structure.

14. A semiconductor device of claim 13 further comprising a lightly doped halo implant adjacent to said source extension.

15. A semiconductor device comprising:
- a super steep retrograde channel region having a substantially linear body biasing voltage to threshold voltage characteristic; and
- a raised source structure.

16. A semiconductor device of claim 15 wherein a body biasing voltage is coupled to said super steep retrograde channel region.

17. A semiconductor device of claim 15 further comprising:
- a substrate comprising a surface;
- a gate oxide disposed above said surface comprising a gate oxide thickness; and
- wherein a depth of said super steep retrograde channel region below said surface is substantially within the range of ten to thirty times said gate oxide thickness.

18. A semiconductor device of claim 17 wherein a horizontal extent of said super steep retrograde channel region is substantially limited to the horizontal extent of said gate oxide.

19. A semiconductor device of claim 15 wherein a one unit change in applied body biasing voltage produces a change in threshold voltage substantially within the range of one tenth to one third of said unit.

* * * * *